(12) United States Patent
Brown

(10) Patent No.: US 6,194,972 B1
(45) Date of Patent: *Feb. 27, 2001

(54) GYRATOR WITH LOOP AMPLIFIERS CONNECTED TO INDUCTIVE ELEMENTS

(75) Inventor: Anthony K. D. Brown, Kanata (CA)

(73) Assignee: Nortel Networks Limited, Montreal (CA)

(*) Notice: Subject to any disclaimer, the term of this patent is extended or adjusted under 35 U.S.C. 154(b) by 0 days.

This patent is subject to a terminal disclaimer.

(21) Appl. No.: 09/244,823

(22) Filed: Feb. 4, 1999

(51) Int. Cl.$^7$ ................................. H03H 11/42
(52) U.S. Cl. .................. 331/108 B; 331/135; 331/175; 330/254; 330/252
(58) Field of Search .................. 330/252, 253, 330/254; 331/57, 108 B, 108 C, 175, 135

(56) References Cited

U.S. PATENT DOCUMENTS

| | | | |
|---|---|---|---|
| 5,343,162 | * 8/1994 | Davis | 330/252 |
| 5,371,475 | 12/1994 | Brown | 330/254 |
| 5,483,195 | 1/1996 | Brown | 330/254 |
| 5,635,880 | 6/1997 | Brown | 331/108 B |
| 6,025,765 | * 2/2000 | Brown | 333/215 |

FOREIGN PATENT DOCUMENTS 0 669 710    8/1995    (EP) .

OTHER PUBLICATIONS

"Design Considerations in High–Frequency CMOS Transconductance Amplifier Capacitor (TAC) Filters", F. Krummenacher, Proc. of the International Symposium on Circuits and Systems, vol. 1, No. Symp.22, May 8, 1989, pp. 100–105.

"An Integrated Low Power Microwave VCO With Sub–picosecond Phase Jitter", A.K.D. Brown, 1996 Proceedings of IEEE BCTM 10.3, Sep. 29–Oct. 1, 1996, Minneapolis, pp. 165–168.

* cited by examiner

Primary Examiner—Arnold Kinkead
(74) Attorney, Agent, or Firm—Angela C. de Wilton

(57) ABSTRACT

A gyrator includes shunt or feedback nodal capacitors and shunt lossy inductors without shunt load resistors. The effective nodal capacitance is reduced by the introduction of the shunt lossy inductors. The inductors act to discriminate against injected power supply noise, resulting in improved oscillator phase noise. The inductors produce less dc voltage drop than the resistive load, so that larger linear oscillation is obtained with improved oscillator phase noise. The gyrator includes an automatic gain control circuit and a tuning control circuit which are separate from each other and fast and slow acting control loops which are augmented with each other.

11 Claims, 16 Drawing Sheets

Angular Frequency

GYRATOR WITH LOOP AMPLIFIERS CONNECTED TO INDUCTIVE ELEMENTS

TECHNICAL FIELD

The present invention relates to a gyrator forming a resonant circuit.

BACKGROUND INFORMATION

In modern communications systems, low phase noise oscillators are required as an integral part of the process of transporting data. While ever increasing data rates are employed, it becomes more and more difficult to meet the requirements for low phase noise. In many applications, the requirement for low phase noise has been met by means of oscillators with fixed frequencies or narrow band tuning range which utilizes some form of a resonant tank circuit of high quality factor (Q). The tank circuit limits the noise bandwidth of the oscillator circuit. In applications where a wider tuning range is needed, it is possible to use a multiple of such oscillators with overlapping tuning ranges. Such arrangements, however, are cumbersome and an alternative class of broad tuning range low noise integrated oscillator is desirable.

U.S. Pat. No. 5,371,475 granted to A. K. D. Brown on Dec. 6, 1994 describes the principles of operation of a class of low noise oscillators, which are known as gyrators. The principles of a conventional gyrator is fully described in the patent. U.S. Pat. No. 5,483,195 granted to A. K. D. Brown on Jan. 9, 1996 describes means of obtaining a broad tuning range for a gyrator oscillator which is independent of process and temperature variations. The prior gyrator needs improvement on achievement of broad tuning range concurrently with low phase noise, for some applications. A paper by A. K. D. Brown entitled "An integrated low power microwave VCO with sub-picosecond phase jitter", IEEE 96CH35966, IEEE BCTM 10.3, pp. 165–168 describes phase noise analysis of gyrators.

SUMMARY OF THE INVENTIONS

It is an object of the present invention to provide a gyrator with an improved phase noise performance.

According to one aspect of the present invention, there is provided a gyrator forming a resonant circuit comprising: a loop having ports 1 and 2, each port having two terminals, the loop comprising loop-connected first and second amplifiers, the gain of the loop being more than unity; capacitive means for coupling the terminals of the respective ports, thereby causing effective nodal capacitance in each port and effective nodal inductance in the other port, the capacitance and inductance determining the resonant frequency of the gyrator; and inductive means for coupling the terminals of the respective ports, thereby the effective nodal capacitance in the respective port being varied. The first and second amplifiers of the loop comprises first and second differential amplifiers, respectively, each differential amplifier having inverting and noninverting inputs and outputs. The loop comprises amplifier coupling means for coupling the inverting and non-inverting outputs of the first differential amplifier to the non-inverting and inverting inputs of the second differential amplifier, respectively, and for coupling the inverting and non-inverting outputs of the second differential amplifier to the inverting and non-inverting inputs of the first differential amplifier, respectively, the gain of the loop comprising the first and second differential amplifiers being greater than unity. Each of the first and second differential amplifiers has a generally 90 degree phase shift between its input and output at the resonant frequency.

For example, each of the first and second differential amplifiers comprises a variable transconductance amplifier. The variable transconductance amplifier comprises tuning means for tuning with a differential voltage. The variable transconductance amplifier further comprises automatic gain control means which is electrically separated from the tuning means. The tuning control means is functionally dependent upon the automatic gain control means. The automatic gain control means comprises a fast acting control loop to ensure oscillation stability under rapid tuning variations.

The gyrator further comprises a fast control loop and a slower control loop for precision vernier adjustment of an output signal level. An output oscillation frequency of the gyrator responds to the variation of the transconductance of the transconductance amplifiers.

BRIEFS DESCRIPTION OF THE DRAWINGS

Embodiments of the present invention will now be described by way of example with reference to the accompanying drawings in which.

DETAILED DESCRIPTION

I. Prior Art

I-1. Gyrator

Figure 1:
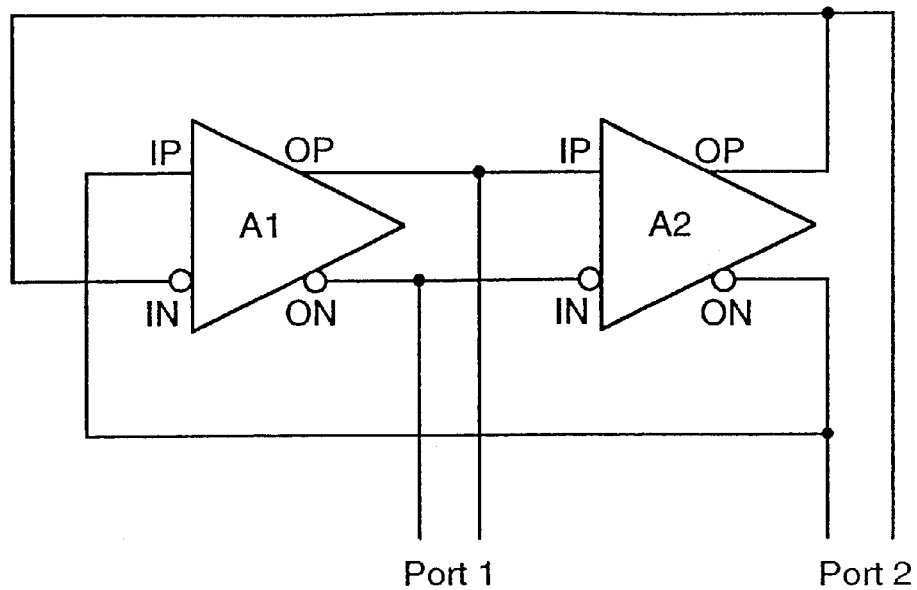
FIG. 1 illustrates a prior art gyrator.

FIG. 1 shows a prior art gyrator including two amplifiers A1 and A2, the gains of which are usually the same. The inverting and non-inverting outputs ON and OP of the amplifier A1 are connected to the inverting and non-inverting inputs IN and IP of the amplifier A2, respectively. The inverting and non-inverting outputs ON and OP of the amplifier A2 are connected to the non-inverting and inverting inputs IP and IN of the amplifier A1, respectively. The amplifiers A1 and A2 are coupled to form a loop, the total gain of which is greater than unity. The outputs of the amplifiers A1 and A2 are ports 1 and 2 of the gyrator, respectively. Operation of the gyrator is described in U.S. Pat. No. 5,483,195, which is incorporated herein by reference.

I-2. Gyrator Model

Figure 2:
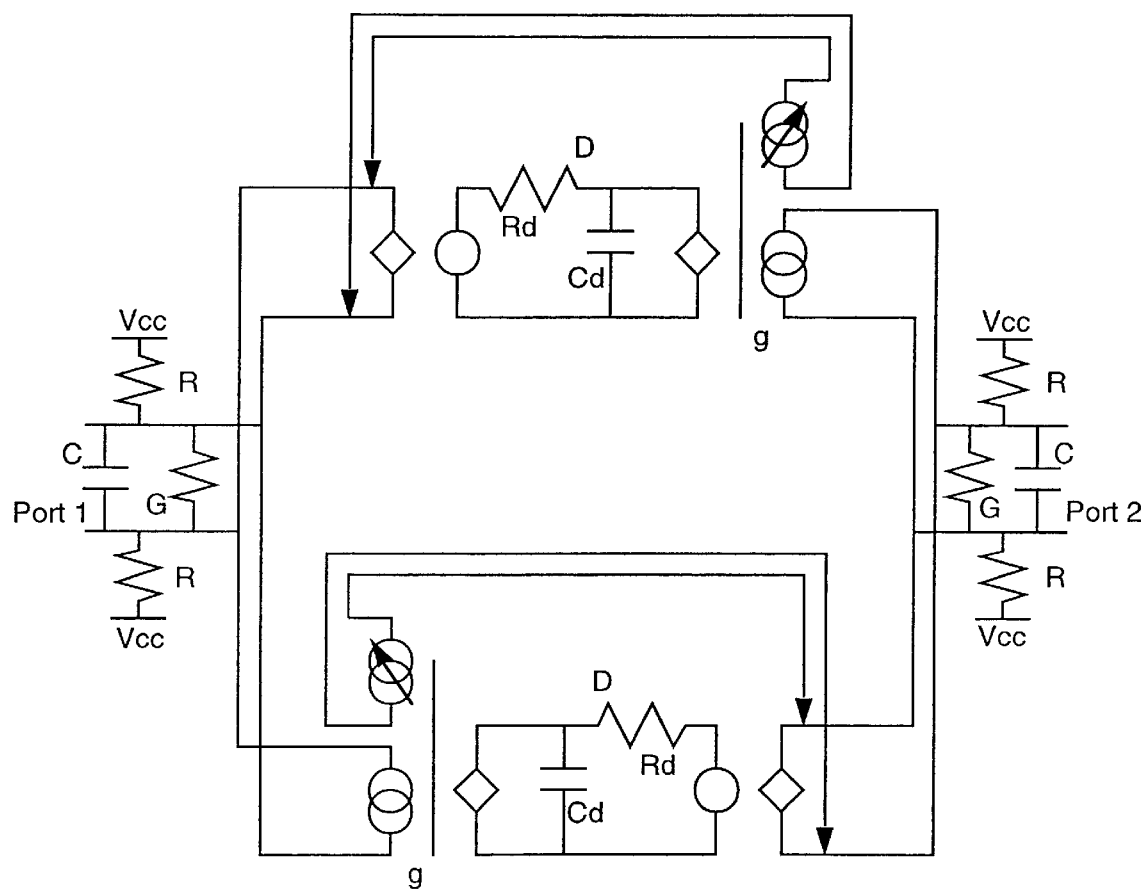
FIG. 2 illustrates a model of a prior art gyrator.
Figure 3:
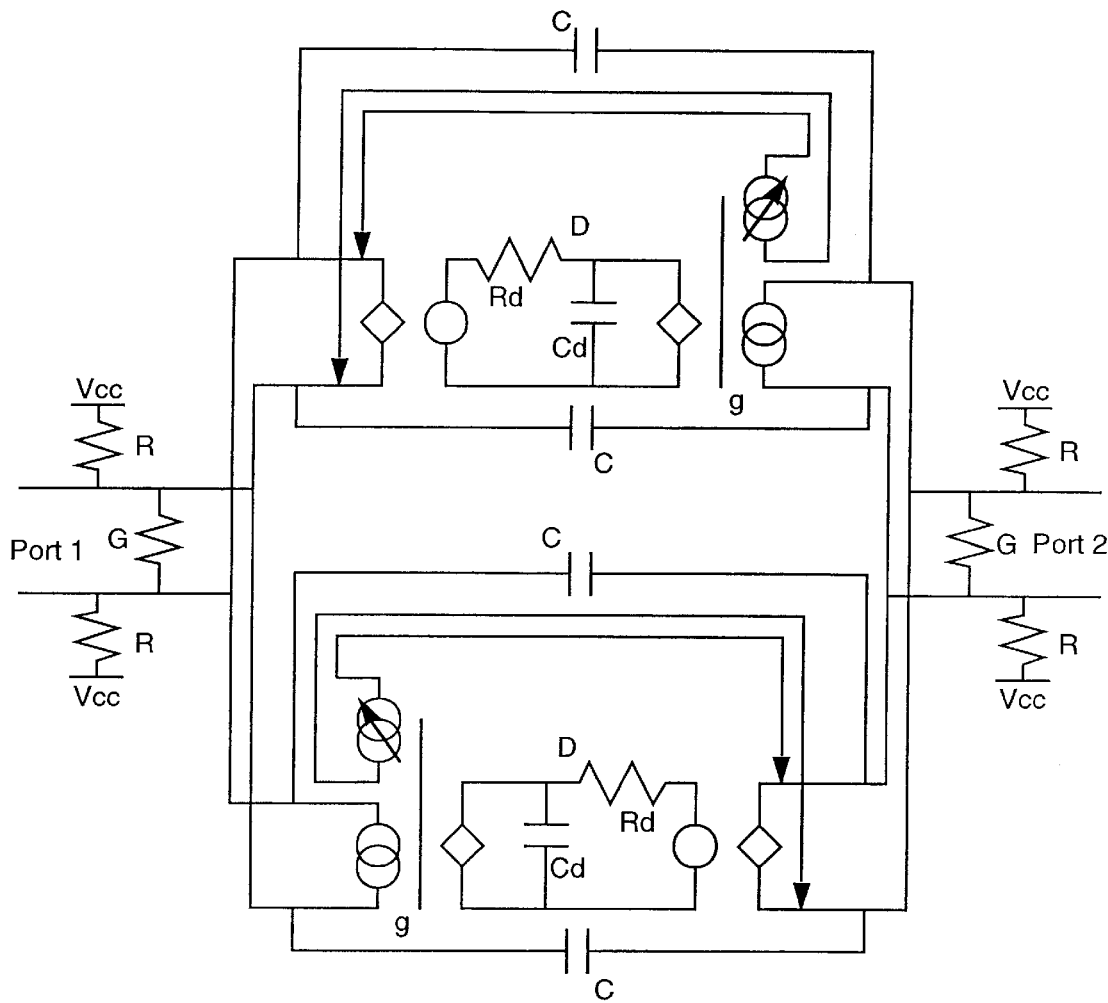
FIG. 3 illustrates a model of another prior art gyrator.

FIG. 2 shows a model of a prior art gyrator having shunt nodal capacitors. The gyrator has two ports—Port 1 and Port 2. Each port has two terminals and a shunt nodal capacitor C is connected between the two terminals which are connected to a terminal of supply voltage Vcc via load resistors R. FIG. 3 shows another prior art gyrator having Miller feedback nodal capacitors C, instead of shunt nodal capacitors. The principles of operation of these gyrators have been fully described in U.S. Pat. No. 5,371,475, which is incorporated herein by reference. Two semi-orthogonal conditions exist for the gyrator of FIG. 1 which are required for unity loop gain at which the gyrator will oscillate. Two possible topologies exist for the basic gyrator circuit as shown in FIGS. 2 and 3, for which identical unity gain conditions exist as:

$$\omega_0 = g/(C+GD) \quad (1)$$

$$D = G/(\omega_0^2 C) \quad (2)$$

Here, $\omega_0$ is a resonant angular frequency, g is a gyrator amplifier transconductance, G is a load loss admittance, D is an amplifier built in delay.

These gyrators are unique in the sense that they emulate a high Q parallel LRC resonant tank circuit with measured Q factors of 250, without employing a physical inductor. The inductor of the resonant circuit is obtained by transforming the capacitive reactance on one of the gyrator nodes so that it appears as an inductor in parallel with the capacitive reactance on the other node. While this feature is highly desirable in supplying a highly selective resonant circuit which suppresses the circuit noise, it is less effective in its ability to suppress unwanted noise from external sources. In this respect, the circuit is twice as sensitive to the effects of externally induced noise as compared to a conventional resonator with passive inductor. This is important because such high frequency noise can modulate the oscillator frequency and alias down into the frequency band of interest.

It will be apparent that the gyrator circuit would be improved if the capacitors could be replaced by inductors: thus one could notionally transform the inductive reactance at one node into a capacitive reactance at the other node and so form a resonant circuit. A mathematical treatment of this procedure, however, results in the requirement that the value of the inductors required for oscillation are finite and negative. Thus, this is not a practical solution.

With reference to FIG. 2, the capacitive admittance at either node (nodal admittance Y) is described as:

$$Y = G + j\omega C \quad (3)$$

The net loss admittance is capacitive. This is a necessary condition for the gyrator to oscillate, as the analysis for a purely inductive circuit shows.

II. First Embodiment Gyrator

II-1. Gyrator Model

Figure 6:
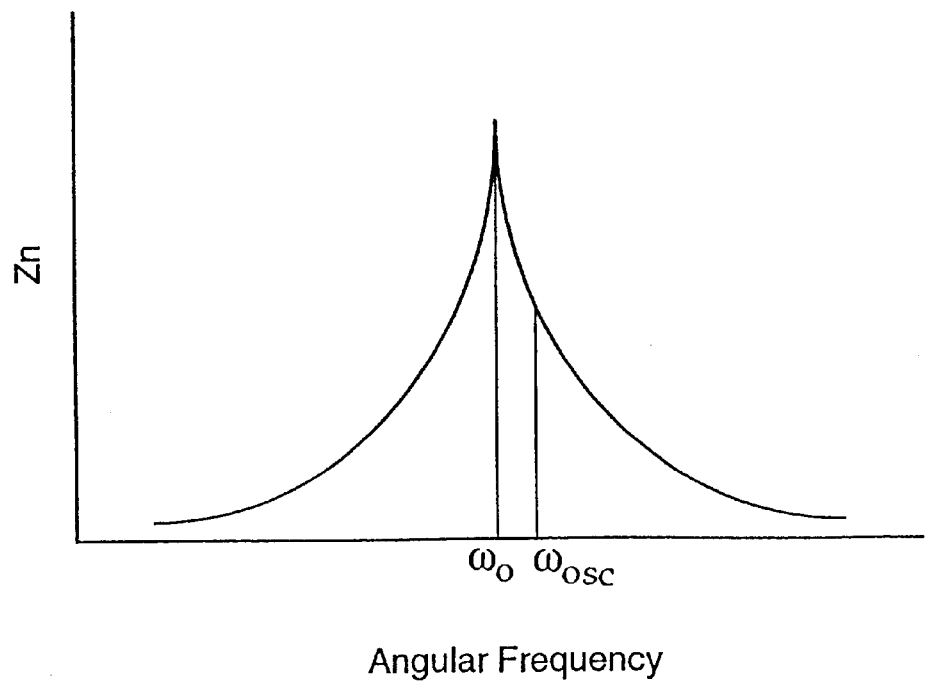
FIG. 6 is a graph of angular frequency—gyrator nodal impedance.
Figure 4:
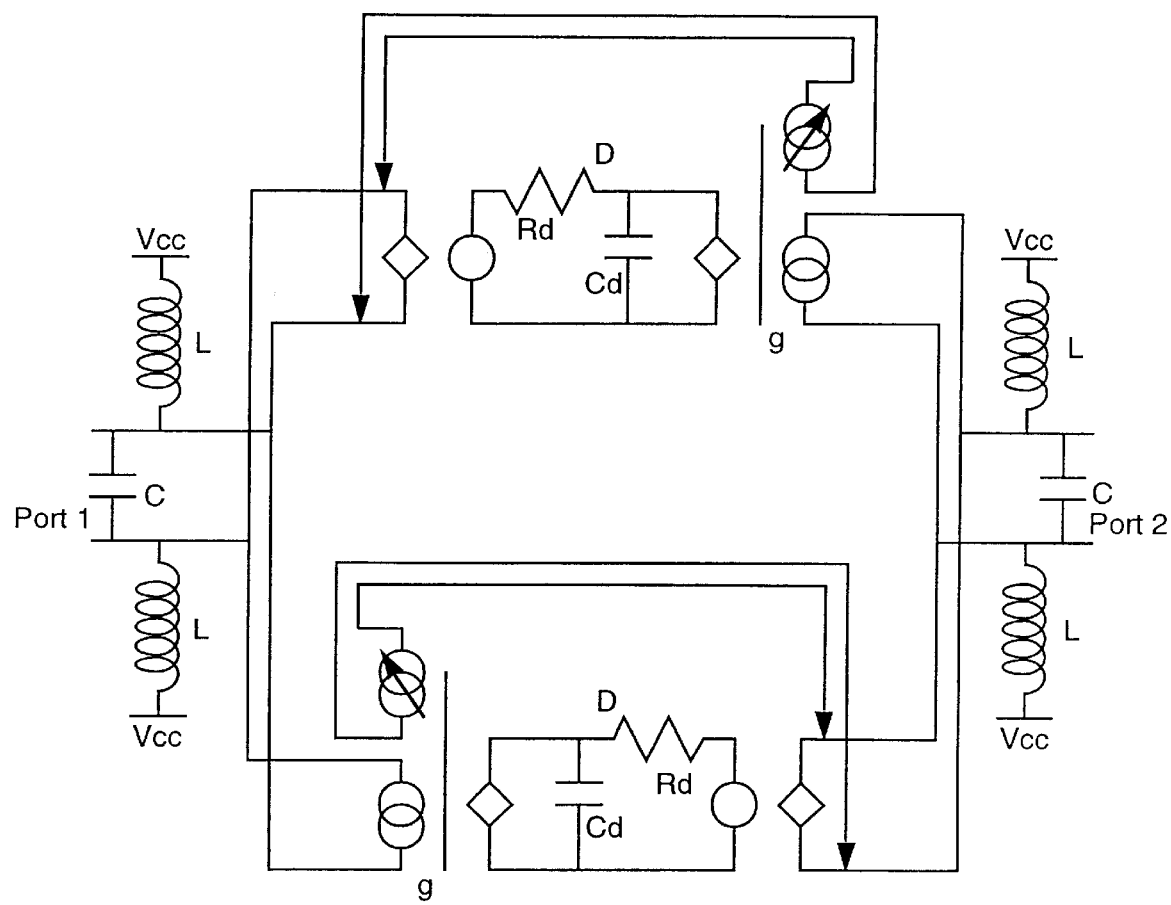
FIG. 4 illustrates a model of an embodiment of a gyrator according to the present invention.
Figure 5:
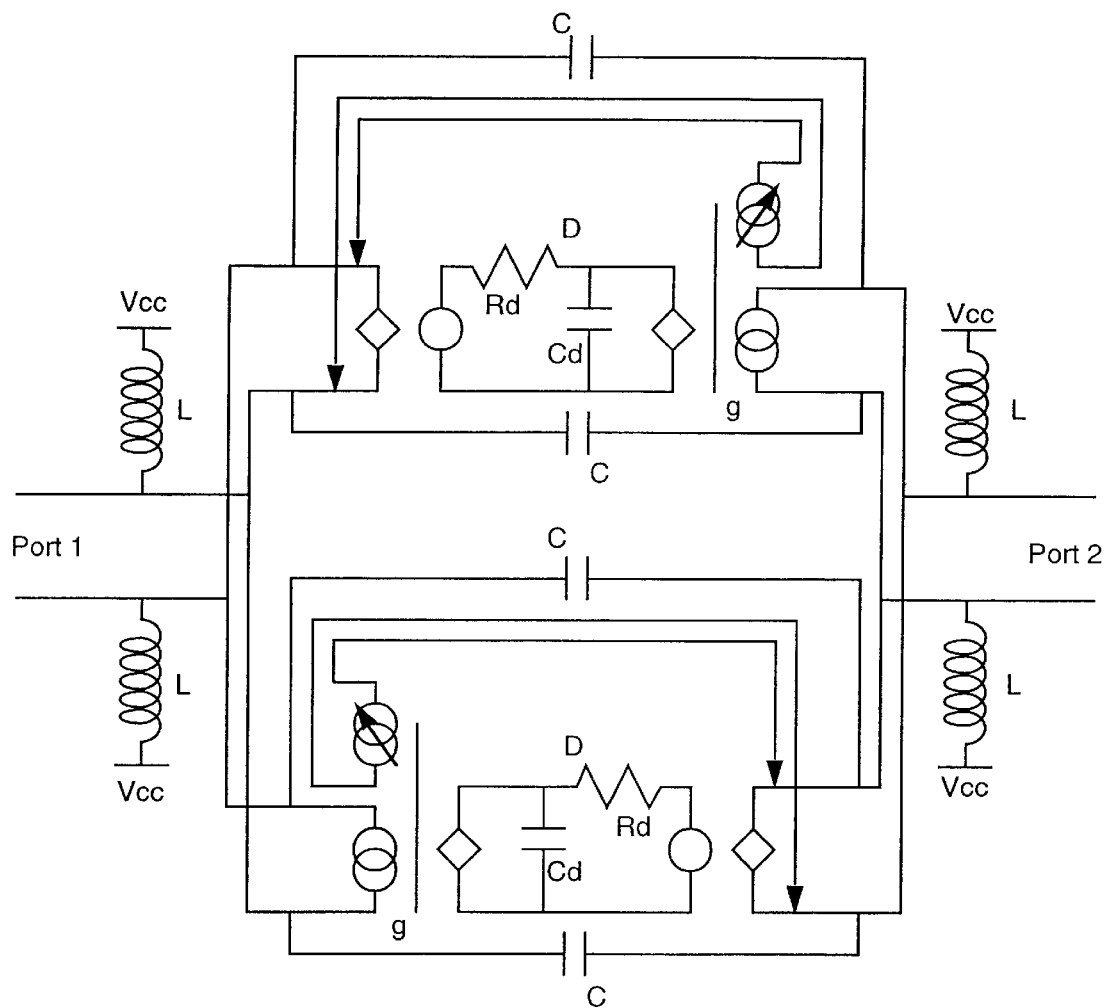
FIG. 5 illustrates a model of another embodiment of a gyrator according to the present invention.

FIG. 4 shows a model of an embodiment gyrator with shunt nodal capacitors and load inductors. In FIG. 4, the gyrator has two ports—Port 1 and Port 2, each port having two terminals. Each port is provided with a shunt nodal capacitor C between its terminals which are connected to a terminal of supply voltage Vcc via load inductors L. FIG. shows a model of another embodiment gyrator having Miller feedback capacitors and load inductors. FIG. 6 illustrates a nodal impedance Zn as function of angular frequency $\omega$. The capacitive admittance at either port (nodal admittance Y) is described as:

$$Y = G + j\omega C + 1/j\omega L \quad (4)$$

$$Y = G + j(\omega C - 1/\omega L) \quad (5)$$

Note the admittance on the imaginary axis can be either capacitive or inductive depending upon the relative magnitude of the capacitance C and inductance L, and, most importantly, the magnitude of the angular frequency $\omega$. At the natural resonant frequency $\omega_0$ of the parallel C and L, their loss admittances are equal, so that the net loss admittance is G (resistive) and the circuit will not oscillate. At frequencies above the frequency $\omega_0$, the capacitive term dominates and the net admittance is capacitive. At this point it is essential to note that the presence of the inductance effectively reduces the capacitive admittance. Therefore, introduced is equivalent capacitance C' which determines new oscillating frequency $\omega_{osc}$ of the gyrator according to Equation 1 and Equation 2 such that:

$$C' = C - (1/\omega^2 L) \quad (6)$$

From Equation 6, it is possible to reduce the effective nodal capacitance Yn by partially cancelling it with the inductor, giving rise to the following desirable attributes:

(1) The oscillatory frequency of the gyrator can be raised higher than that attainable for the conventional gyrator of FIGS. 2 and 3 by introducing a parallel inductor to partially cancel the nodal capacitance as in FIG. 4.

(2) Alternatively a larger nodal capacitance can be employed at the same oscillator frequency by introducing a parallel inductor to partially cancel the nodal capacitance.

The ability to raise the oscillator frequency is very useful when the desired frequency is otherwise unattainable in a conventional gyrator due to parasitic capacitances.

The ability to increase the nodal capacitance is desirable when the gyrator nodal capacitance largely consists of non-linear parasitic capacitance which lowers the Q factor of the gyrator. By introducing a shunt linear capacitor and a shunt inductor, the net capacitance is more linear since the parasitics are largely swamped, while the same resonant frequency is attained.

In addition, the shunt load resistor used in the conventional gyrator appears in parallel with the added inductor and an equivalent Q factor can be calculated for the inductor resistor combination. Conveniently, the shunt resistor inductor combination can be replaced by a series combination of the inductor and a resistor having the same combined Q factor. The value of the series resistor is calculated to achieve the same Q factor as for the shunt inductor resistor combination. In practice, integrated inductors can be designed having the required Q factor without the requirement for an additional series resistor.

FIG. 6 shows the nodal impedance as a function of angular frequency, where $\omega_0$ is the resonant angular frequency and $\omega_{osc}$ is the oscillating angular frequency. The oscillating angular frequency $\omega_{osc}$ is shifted from the resonant angular frequency $\omega_o$ by C'.

Figure 7:
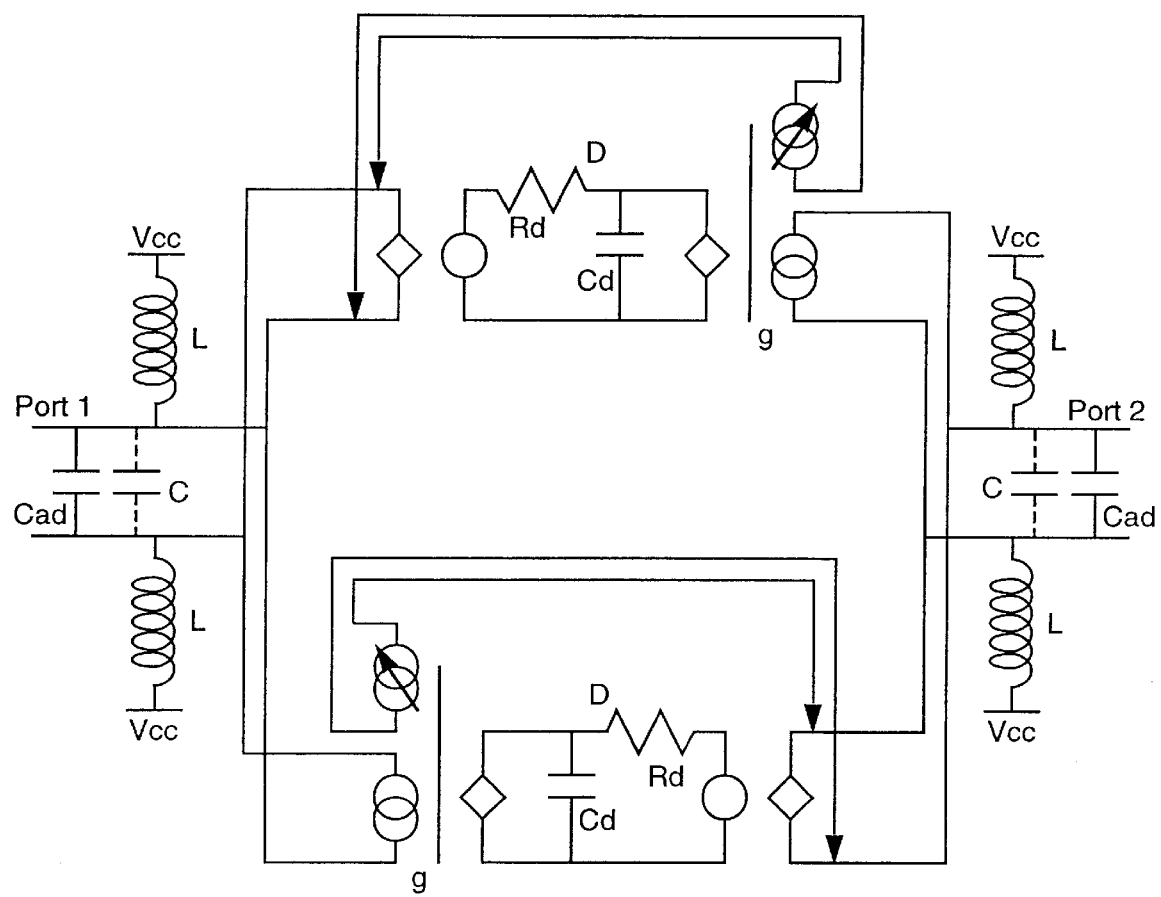
FIG. 7 illustrates a model of another embodiment of a gyrator according to the present invention.
Figure 8:
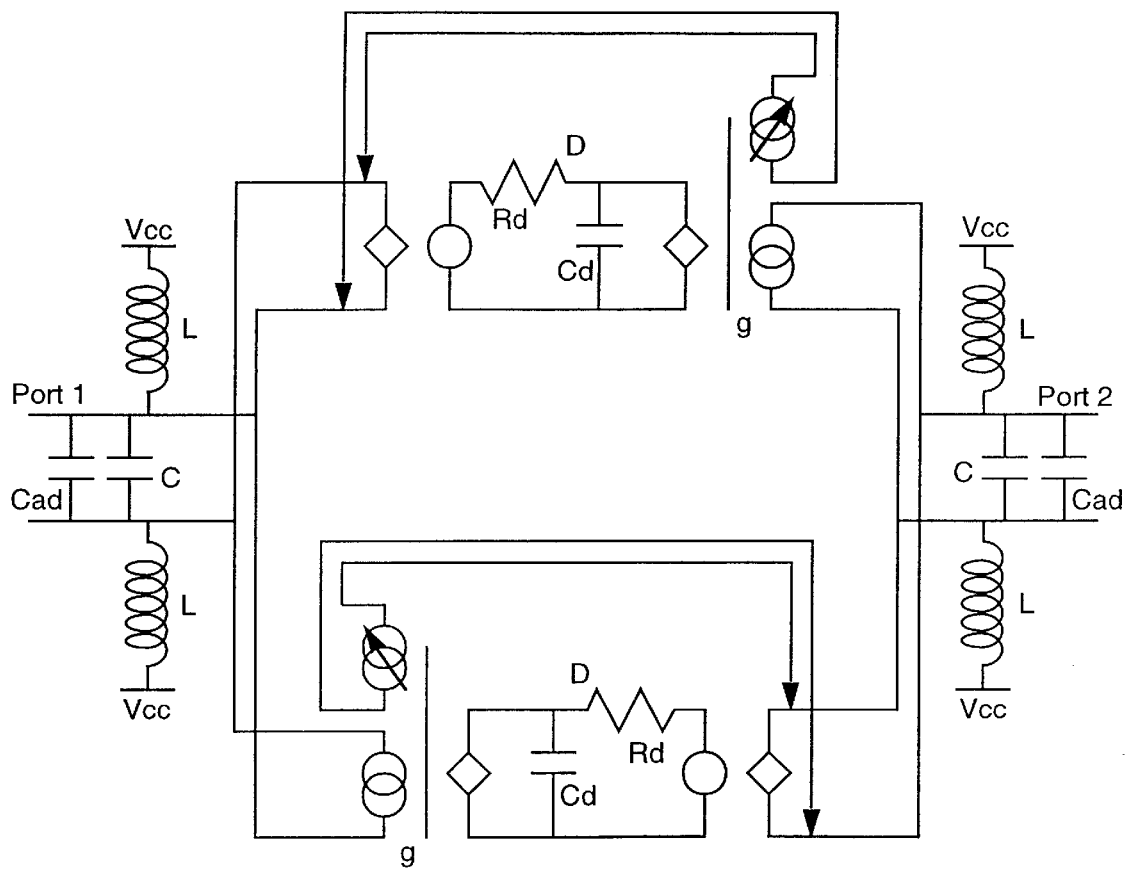
FIG. 8 illustrates a model of another embodiment of a gyrator according to the present invention.

FIG. 7 shows a model of an embodiment gyrator wherein nodal shunt capacitances are combination of parasitic capacitances C and additional capacitances Cad. The gyrator improves its linearity. FIG. 8 shows a model of an embodiment gyrator wherein nodal shunt capacitances are combination of capacitances C and additional capacitances Cad. The gyrator increases its oscillation frequency and improves its linearity.

Three examples will be given below for the comparison purpose.

EXAMPLE 1

Prior Art Gyrator of FIG. 2
Resonant Frequency=1 GHz
Nodal Capacitance C=1 pF
Shunt Load Resistance=350 Ω
Embodiment Gyrator of FIG. 4
Oscillation Frequency=2 GHz
Inductance L=8.4 nH
  (Inductor's Q factor=3.3)

Note that the parallel resonance frequency of the 1 pF capacitor and 8.4 nH inductor is 1.73 GHz and the equivalent capacitive reactance of the parallel combination at the 2 GHz oscillation frequency is 0.25 pF. In this example, the oscillating angular frequency $\omega_{osc}$ is shifted from the resonant angular frequency $\omega_o$ to a higher frequency (see FIG. 6).

EXAMPLE 2

Prior Art Gyrator
Resonant Frequency=1 GHz
Nodal Capacitance C=1 pF
  (consisting of non-linear circuit parasitics)
Shunt Load Resistance=350 Ω
Embodiment Gyrator (see FIG. 7)
Oscillation Frequency=1 GHz
Inductance L=12.7 nH
  (Inductor's Q factor=4.38)
Additional Shunt Capacitance Cad=2 pF Note that the self resonant frequency of the parallel inductor capacitor combination is 0.816 GHz. The equivalent nodal capacitance is still 1 pF. In this example, the oscillating angular frequency $\omega_{osc}$ is substantially the same as the resonant angular frequency $\omega_o$.

EXAMPLE 3

Prior Art Gyrator
Resonant Frequency=1 GHz
Nodal Capacitance C=1 pF
Shunt Load Resistance=350 Ω
Embodiment (see FIG. 8)
Oscillation Frequency=2 GHz
Inductance L=3.6 nH
  (Inductor's Q factor=7.73)
Additional Shunt Capacitance Cad=1 pF In this example, the gyrator oscillation frequency can be increased to a 2 GHz oscillation frequency while at the same time doubling the nodal capacitance linearity.

Thus, the ability to double the gyrator frequency while doubling the nodal capacitance can be achieved by replacing the shunt nodal load resistor with a shunt lossy inductor which at the same time achieves the purpose of discriminating against injected power supply noise. The filtering action of the inductor depends on the inductor capacitor combination and is enhanced where the nodal capacitance is increased. In the case of example 2, the attenuation of high frequency power supply noise increases at 12 dB per octave above 1 GHz as compared to the unmodified gyrator with 6 dB per octave. Thus, the improved gyrator has 43.6 dB attenuation of 10 GHz noise as compared to the unmodified gyrator with 27.2 dB.

A further advantage of replacing the resistive loads with lossy inductive loads is that the passive inductors can store energy, thus permitting voltage excursions above the supply rail. Also, of great advantage is the increased voltage swing possible with a given power supply since the dc voltage drop due to the 350 Ω load resistor is no longer present.

II-2. Detailed Circuit of the First Embodiment Gyrator

Figure 9:
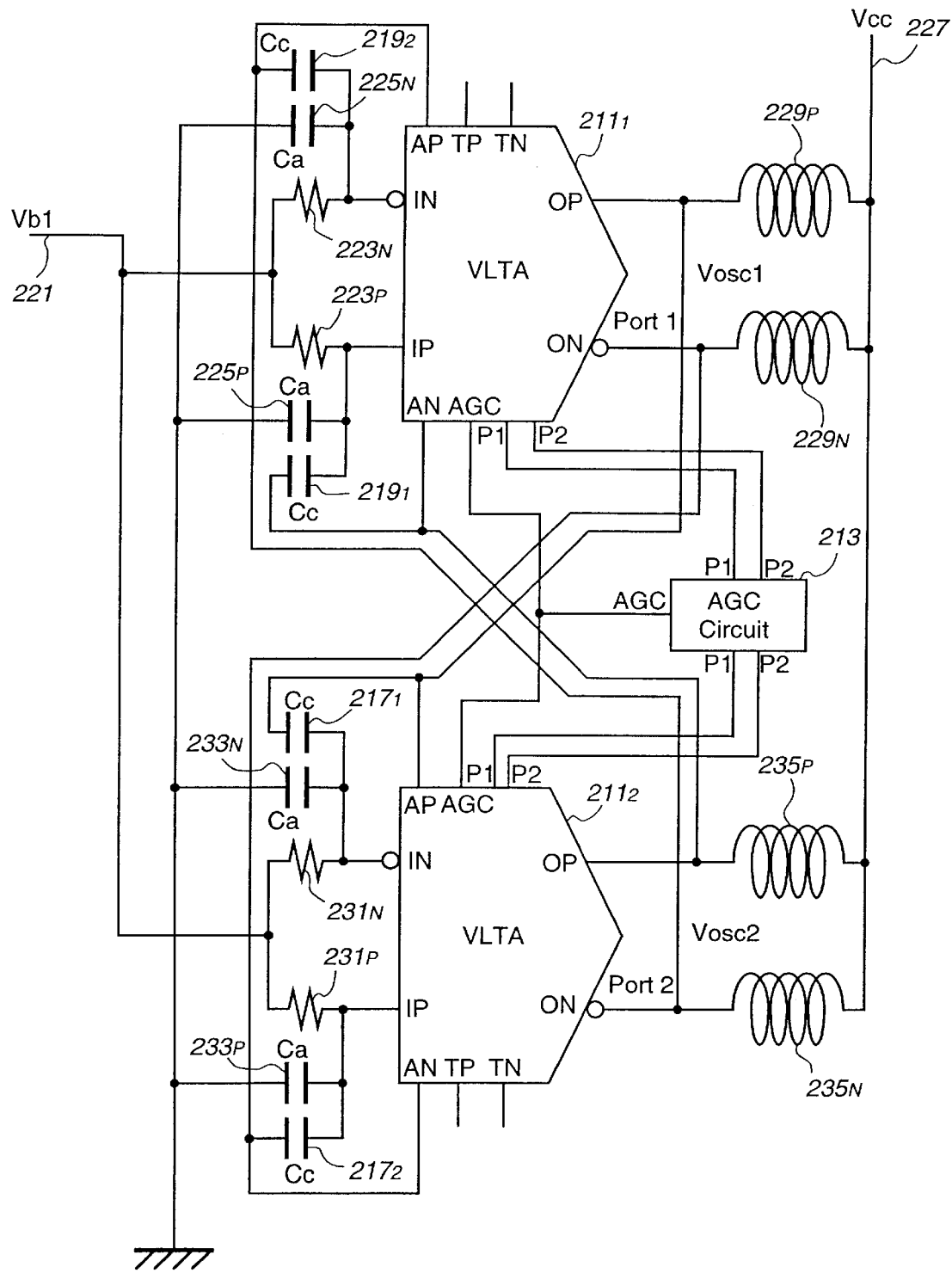
FIG. 9 is a schematic diagram of an embodiment of a gyrator according to the present invention.

Referring to FIG. 9 which shows a gyrator according to an embodiment of the present invention, the gyrator includes two variable linear transconductance amplifiers (VLTAs) $211_1$ and $211_2$ having the same circuit configuration and an automatic gain control (AGC) circuit 213. Each of the VLTAs $211_1$ and $211_2$ has inverting and non-inverting inputs IN and IP and inverting and non-inverting outputs ON and OP. Each VLTA provides differential output voltage between its non-inverting and inverting outputs OP and ON in response to differential input voltage fed between its non-inverting and inverting inputs IP and IN. The outputs OP and ON of the VLTA $211_1$ are connected to the inputs IN and IP of the VLTA $211_2$ via capacitors $217_1$ and $217_2$, respectively. The outputs OP and ON of the VLTA $211_2$ are connected to the inputs IP and IN of the VLTA $211_1$ via capacitors $219_1$ and $219_2$, respectively. Each of the capacitors $217_1$, $217_2$, $219_1$ and $219_2$ has capacitance Cc. The inputs IP and IN of the VLTA $211_1$ are connected to a bias terminal 221 to which bias voltage Vb1 is fed, via resistors 223P and 223N, respectively. The inputs IP and IN of the VLTA $2111$ are connected to the ground terminal via capacitors 225P and 225N, respectively. The outputs OP and ON of the VLTA $211_1$ are connected to a terminal 227 of supply voltage Vcc (e.g., +5 V), via inductors 229P and 229N, respectively. The inputs IP and IN of the VLTA $211_2$ are connected to the bias terminal 221 via resistors 231P and 231N, respectively. The outputs OP and ON of the VLTA $211_1$ are connected to other inputs AP and AN of the $VLTA_2$, respectively. The outputs OP and ON of the VLTA $211_2$ are connected to other inputs AN and AP of the $VLTA_1$, respectively. The inputs IP and IN of the VLTA $211_2$ are connected to the ground terminal via capacitors 233P and 233N, respectively. Each of the capacitors 225N, 225P, 233N and 233P has capacitance Ca. The outputs OP and ON of the VLTA $211_2$ are connected to the terminal 227 via inductors 235P and 235N, respectively. Peak detection terminals P1 and P2 of the VLTAs $211_1$ and $211_2$ are connected to the respective peak detection terminals P1 and P2 of the AGC circuit 213, the AGC terminal of which is connected to AGC terminals of VLTAs $211_1$ and $211_2$.

The outputs OP and ON of the VLTA $211_1$ are defined as "Port 1" and the outputs OP and ON of the VLTA $211_2$ are defined as "Port 2". The nodal capacitance of the each port is a series of the two capacitances Cc and the two capacitances Ca. The VLTAs $211_1$ and $211_2$ are biased through the resistors 223N, 223P and 231N, 231P by the bias voltage Vb1. The VLTAs $211_1$ and $211_2$ develop large voltage swings in the inductors 229P, 229N, 235P and 235N. The gain of the VLTA 211$_1$ is the same one as that of the VLTA 211$_2$. A total gain of a loop comprising the VLTAs 211$_1$ and 211$_2$ is greater than unity. Each of the VLTAs 211$_1$ and 211$_2$ has a 90 degree phase shift between its input and output at a resonant frequency. Quadrature output voltage Vosc1 and Vosc2 are provided from Ports 1 and 2, respectively. The capacitors 225N, 225P, 233N and 233P of the capacitance Cc attenuate the signals at the inputs of the VLTAs 211$_1$ and 211$_2$, so as to avoid overloading the VLTAs.

Figure 10:
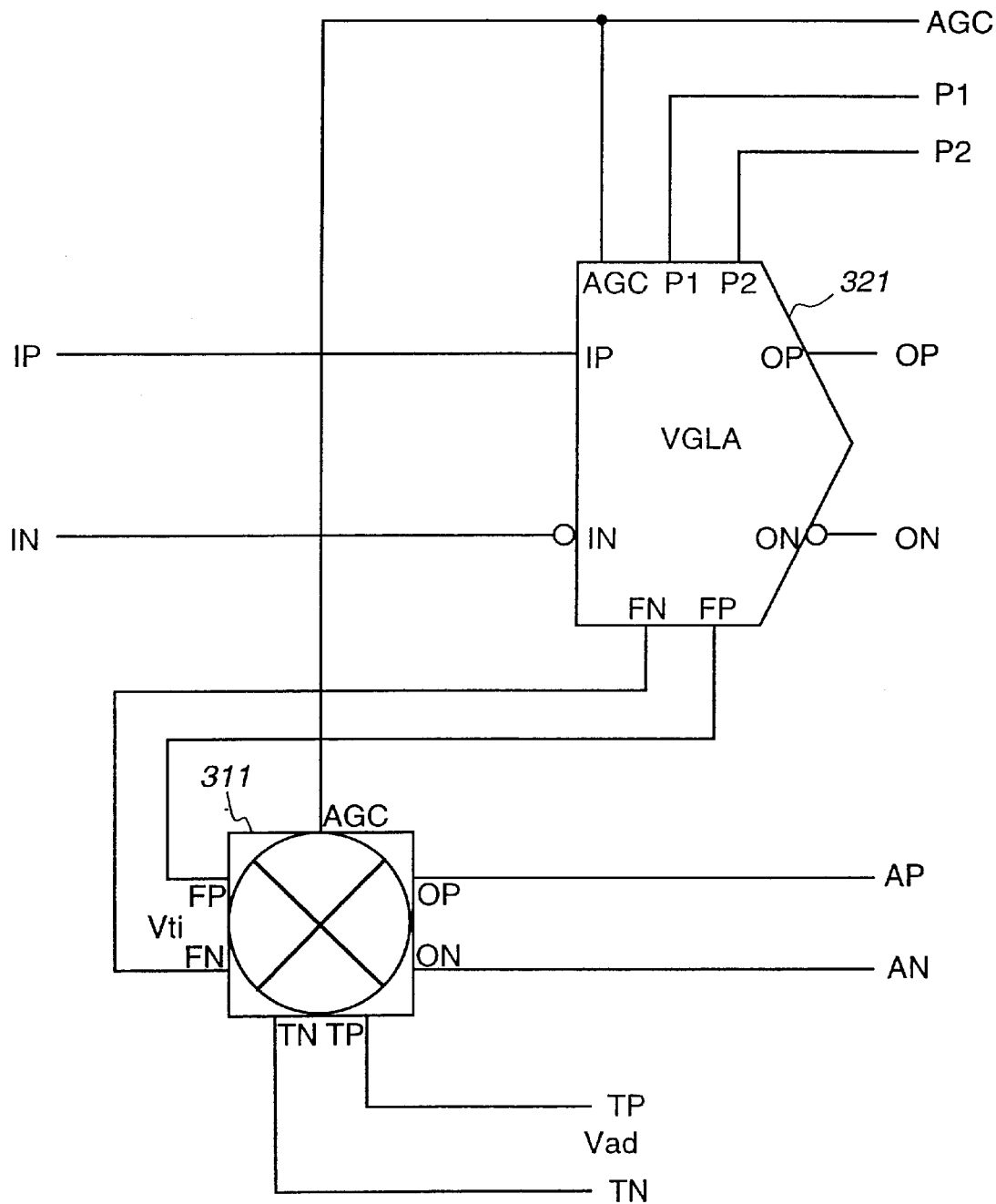
FIG. 10 is a block diagram of a variable linear transconductance amplifier used in the gyrator shown in FIG. 9.

FIG. 10 shows the VLTA which includes a tuner 311 and a variable gain linear amplifier (VGLA) 321. The non-inverting and inverting inputs IP and IN of the VLTA are connected to non-inverting and inverting inputs IP and IN of the VGLA 321, respectively, the non-inverting and inverting outputs OP and ON of which are connected to the non-inverting and inverting outputs OP and ON of the VLTA. Tuning terminals FP and FN of the VGLA 321 are connected to the tuning terminals FP and FN of the tuner 311, the tuning inputs TP and TN are connected to the tuning inputs of the VLTA. The inputs AP and AN of the VLTA are connected to the outputs OP and ON of the tuner 11. The AGC terminals of the tuner 311 and VGLA 321 are connected to the AGC terminal of the VLTA to which AGC voltage Vagc is fed. The tuning inputs TP and TN are provided with differential tuning adjustable voltage Vad (the source of which is not shown). Differential tuning input voltage Vti is fed from the tuning terminals FP and FN of the VGLA 321 to the tuning terminals FP and FN of the tuner 311.

The tuner 311 and the VGLA 321 are combined to create a linear tuning arrangement. This technique is based on the vector summation of the amplifier output current with a variable quadrature feedback signal, so as to alter the transconductor amplifier delay and hence the gyrator frequency.

Figure 11:
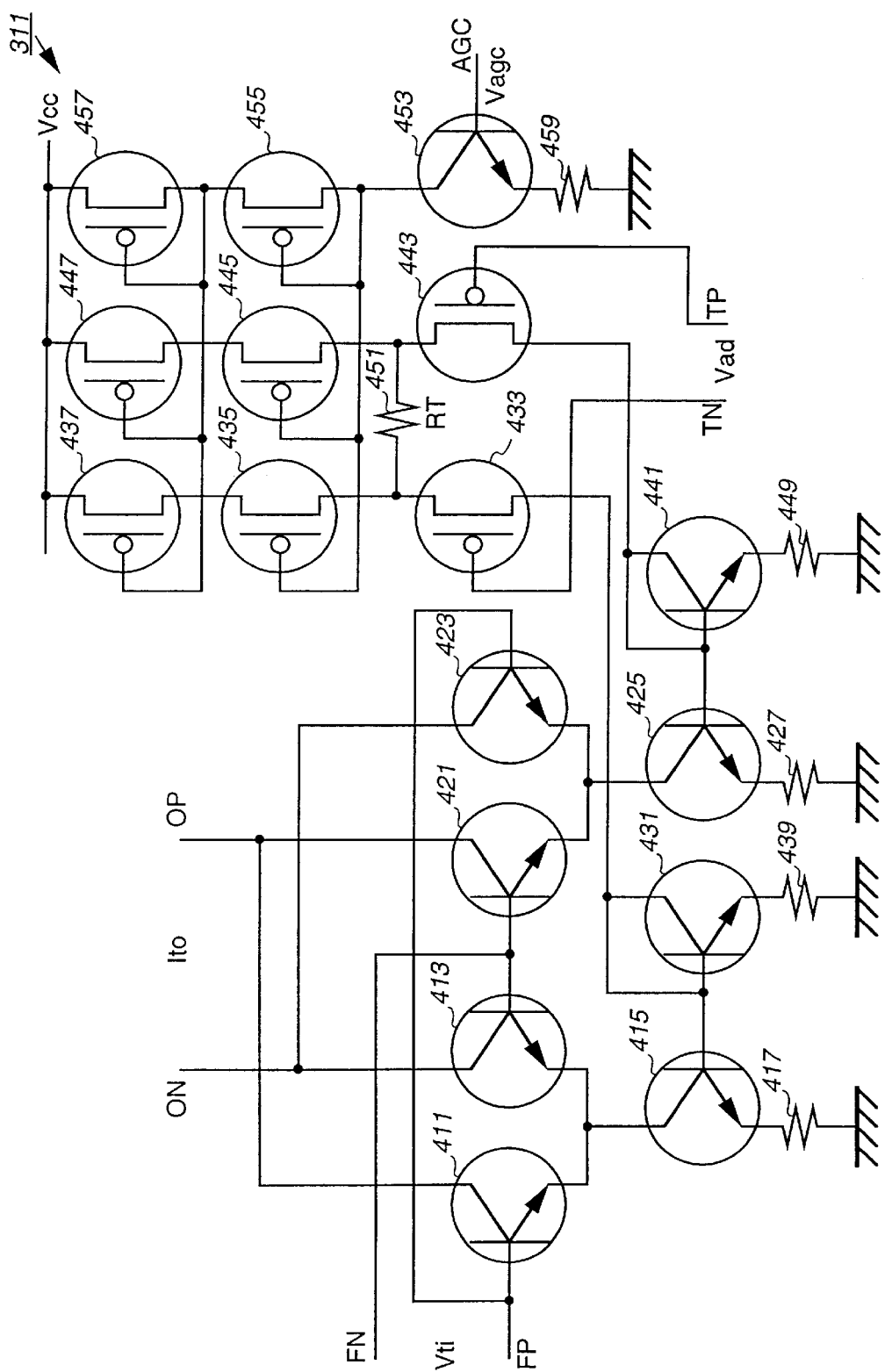
FIG. 11 is a schematic diagram of a tuning circuit used in the transconductance amplifier shown in FIG. 10.

FIG. 11 shows the tuner 311 of FIG. 10. The following description assumes, for simplicity and purely by way of example, that the FETs referred to are P-channel MOSFETs (metal oxide semiconductor field effect transistors) and the transistors referred to are NPN-type bipolar transistors. In FIG. 11, the tuner 311 includes two differential amplifier circuits of transistors 411, 413, 415 and a resistor 417 and transistors 421, 423, 425 and a resistor 427. The tuning terminals FP and FN are connected to the bases of the transistors 411, 423 and the bases of the transistors 413, 421, respectively. The non-inverting and inverting outputs OP and ON of the tuner 311 are connected to the collectors of the transistors 411, 421 and the collectors of the transistors 413, 423, respectively. The base of the transistor 415 is connected to the base of a transistor 431, the base and collector of which are connected to series-connected FETs 433, 435 and 437. The emitter of the transistor 431 is connected to the ground terminal via a resistor 439. Similarly, the base of the transistor 425 is connected to the base of a transistor 441, the base and collector of which are connected to series-connected FETs 443, 445 and 447. The emitter of the transistor 441 is connected to the ground terminal via a resistor 449. The tuning inputs TP and TN are connected to the gates of the FETs 443 and 433, respectively. A resistor 451 of resistance RT is connected between the sources of the FETs 433 and 443. The AGC terminal is connected to the base of a transistor 453, the collector of which is connected to series-connected FETs 455 and 457. The emitter of the transistor 453 is connected to the ground terminal via a resistor 459. The sources of the FETs 437, 447 and 457 are connected to a terminal of dc supply voltage Vcc (e.g., +5 volts). The differential tuning adjustable voltage Vad is fed to the gates of the FETs 443 and 433. The differential tuning input voltage Vti is fed to the bases of the transistors 411 and 413 from the collectors of which the differential tuning output current Ito is provided.

The tuner 311 is essentially a four quadrant mixer which multiplies the differential tuning input voltage Vti with the differential tuning adjustable voltage Vad, so as to produce the differential tuning output current Ito having a variable amplitude. The base of the transistor 453 is provided with the AGC voltage Vagc which is also fed to the VGLA 321.

Figure 12:
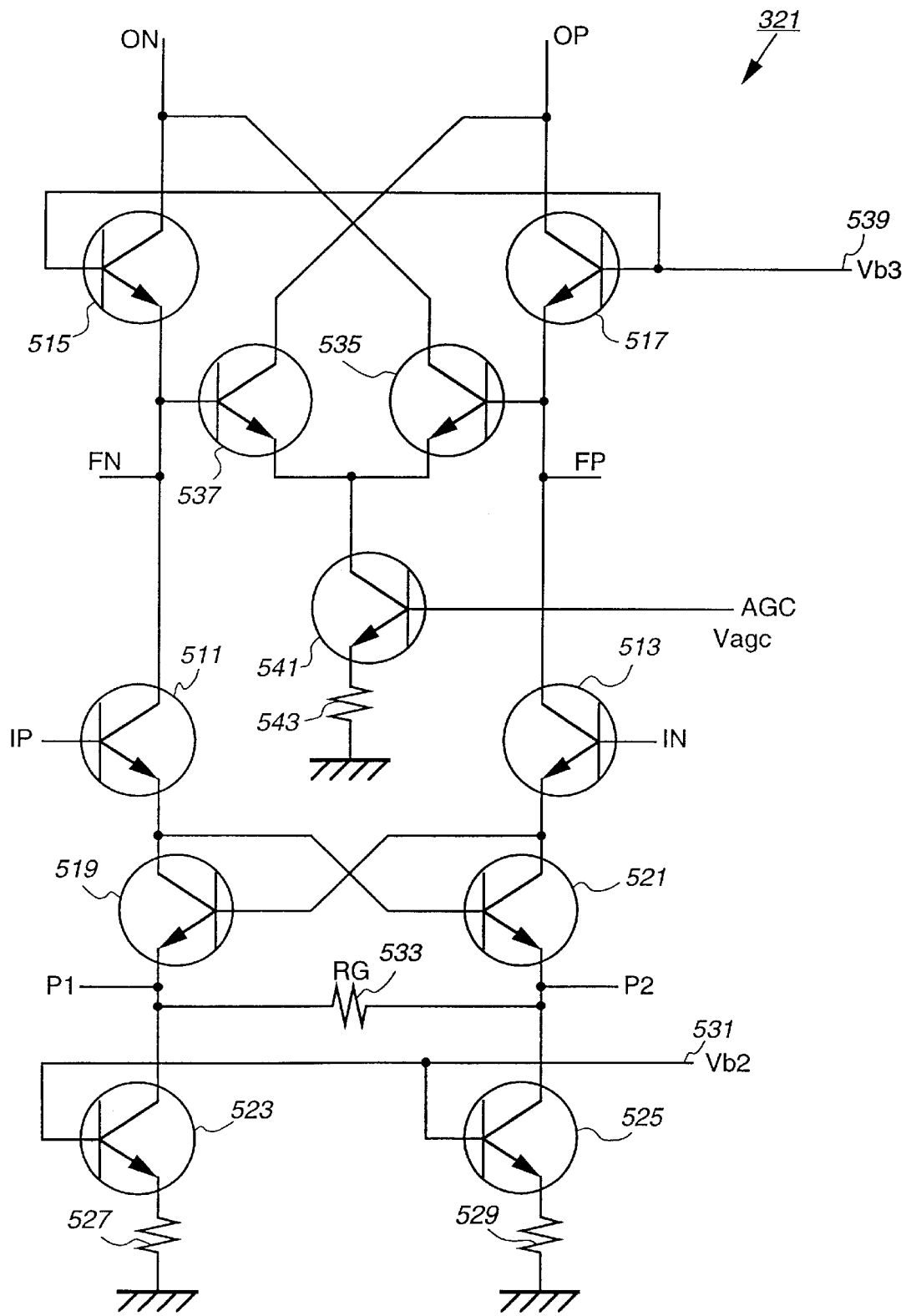
FIG. 12 is a schematic diagram of a variable gain linear transconductance amplifier used in the transconductance amplifier shown in FIG. 10.

FIG. 12 shows the VGLA 321 of FIG. 10. In FIG. 12, the non-inverting and inverting inputs IP and IN of the VGLA 321 are connected to the bases of transistors 511 and 513, the collectors of which are connected to the emitters of transistors 515 and 517, respectively. The emitter of the transistor 511 is connected to the collector of a transistor 519 and the base of a transistor 521. The emitter of the transistor 513 is connected to the collector of the transistor 521 and the base of the transistor 519. The emitters of the transistors 519 and 521 are connected to the collectors of transistors 523 and 525, respectively, the emitters of which are connected to the ground terminal via resistors 527 and 529, respectively. The bases of the transistors 523 and 525 are connected to a bias terminal 531 to which bias voltage Vb2 is fed. A gain control resistor 533 of resistance RG is connected between the emitters of the transistors 519 and 521. The collectors of the transistors 515 and 517 are connected to the inverting and non-inverting outputs ON and OP of the VGLA 321, respectively, and to the collectors of transistors 535 and 537, respectively. The bases of the transistors 515 and 517 are connected to a bias terminal 539 to which bias voltage Vb3 is fed. The emitters of the transistors 535 and 537 are connected to the collector of a transistor 541, the emitter of which is connected to the ground terminal via a resistor 543. The base of the transistor 541 is connected to the AGC terminal. Each of the voltages Vb2 and Vb3 is fed by a constant voltage source (not shown).

The VGLA 321 is a differential amplifier. The transistors 523 and 525 with the emitter degeneration resistors 527 and 529 operate as current sources. The transistors 515, 517, 535 and 537 operate on the translinear principle. The impedance seen at the emitters of the transistors 515 and 517 is very low, typically a few ohms, since it is the reciprocal of the transconductance of these transistors plus some parasitic resistance. The transconductance of this complete amplifier can be controlled by varying the current sourced into the AGC input.

The transistors 519 and 521 are added in order to make the input amplifier linear. The non-linear characteristic of the positive feedback pair 519 and 521 is the exact opposite of the non-linear characteristic of transistors 511 and 513, thus creating a highly linear amplifier out of transistors 511, 513, 519 and 521. The combination of this linear input amplifier and the linear output amplifier results in that the circuit of FIG. 12 is a highly linear high speed variable gain transconductance amplifier. Voltage across the resistor 533 is used by the AGC circuit for peak detection. The voltage (i.e., the differential tuning input voltage Vti) between the tuning terminals FP and FN is used for tuning control.

Figure 13:
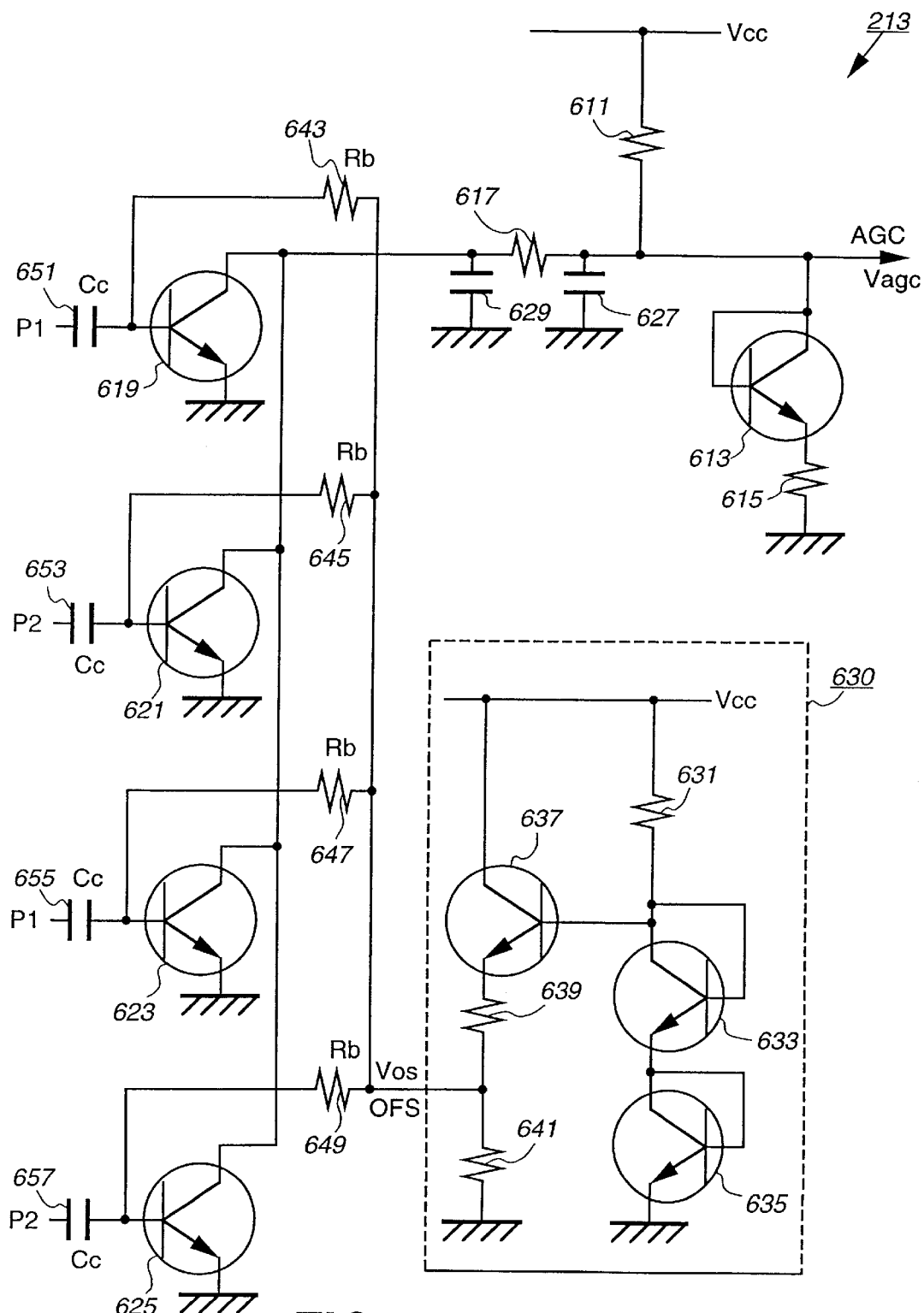
FIG. 13 is a schematic diagram of an automatic gain control circuit used in the transconductance amplifier shown in FIG. 9.

FIG. 13 shows an AGC circuit 213 of FIG. 9. In FIG. 13, a resistor 611, a diode-connected transistor 613 and a resistor 615 are connected in series between a terminal of the supply voltage Vcc and the ground terminal. The AGC terminal is connected to the collector of the transistor 613 and via a resistor 617 to the collectors of transistors 619, 621, 623 and 625, the emitters of which are connected to the ground terminal. Both the terminals of the resistor 617 are connected to the ground terminal via capacitors 627 and 629.

The AGC circuit 213 includes an offset circuit 630 wherein a resistor 631 and two diode-connected transistors 633 and 635 are connected in series between the Vcc terminal and the ground terminal. The collector of the transistor 633 is connected to the base of a transistor 637, the emitter of which is connected to the ground terminal via series-connected resistors 639 and 641. The collector of the transistor 637 is connected to the Vcc terminal. The junction of the resistors 639 and 641 is connected to an output OFS of the offset circuit 630.

The output OFS is connected to the bases of the transistors 619, 621, 623 and 625 via resistors 643, 645, 647 and 649, respectively. Each of the resistors 643, 645, 647 and 649 has resistance Rb. The bases of the transistors 619 and 621 are connected to the peak detection terminals P1 and P2 of the VGLA 321 of the VLTA $211_1$ via capacitors 651 and 653, respectively. Similarly, the bases of the transistors 623 and 625 are connected to the peak detection terminals P1 and P2 of the VGLA 321 of the other VLTA $211_2$ via capacitors 655 and 657, respectively.

The circuit 213 is a typical AGC arrangement to keep the VLTAs $211_1$ and $211_2$ operating in the linear region. Under start-up conditions, the resistor 611 supplies current from the supply voltage Vcc to the transistor 613. This establishes the bias AGC voltage Vagc which is fed to the transistor 453 of the tuner 311 and the transistor 541 of the VGLA 321. Once the oscillator signal reaches the required amplitude, the remaining circuit of the AGC circuit 213 reduces the AGC bias voltage as described below.

The transistors 619, 621, 623 and 625 operate as peak detectors. The resistors 643, 645, 647 and 649 permit a bias voltage to be presented to the transistors 619, 621, 623 and 625, so as to bias these transistors off by a predetermined offset voltage Vos derived from the offset circuit 630. If the emitter current density in the transistors 633, 635 and 637 is the same, then the offset voltage Vos will be given by:

$$Vos=Vbe \times Rdiv$$

Where Vbe is the base-emitter voltage of the transistors. Rdiv is a voltage division ratio which is given by:

$$Rdiv=R_{641}/(R_{639}+R_{641})$$

Where $R_{639}$ and $R_{641}$ are the resistances of the resistors 639 and 641, respectively. The offset voltage Vos has a negative temperature coefficient which is the same as that of a semiconductor diode: i.e., approximately $-0.002 \times Rdiv$ v/C. In order to cancel the negative temperature coefficient, and maintain a constant oscillator output voltage level, it is necessary to increase the emitter current density of the transistor 637 relative to that of the transistors 633 and 635. This will create an additional offset voltage at the output OFS of the offset circuit 630 with a positive temperature coefficient. This is an application of the band gap principle used in band gap voltage generators. Finally one also has to take into account the ratio of the peak emitter current density in the transistors 619, 621, 623 and 625 relative to the transistor 635, and typically this would be made unity to avoid any additional temperature effects in the oscillator output level. It has been assumed in this description that the temperature coefficient of the resistance of the resistor 631 is zero. If this is not true, its effect can be cancelled by modifying the emitter current density ratio in the transistors 637 and 633 in conjunction with the ratio Rdiv.

In a typical arrangement, a 5.9 GHz oscillator with 5 Vp-p differential quadrature outputs can be obtained with this oscillator. The supply voltage must be at least 5 V relative to ground potential. Values of the capacitors in FIG. 9 are as follows:

Cc=0.5 pF

Ca=1.5 pF

The capacitor attenuator is thus 3:1 and a 2.5 volts single ended swing at the output creates a 0.83 volt single ended swing at the input.

For the differential amplifier to operate in its linear range, the value of the resistor RG multiplied by the current sunk in transistors 523, 525 must exceed 2 volts. This is controlled by the bias voltage Vb2. In this design, RG is 1 kΩ and the current sink is 2 mA. The AGC limited the output to 2.6 Vp-p, or 5.2 V differential peak-peak. The value of the inductors is 2 nH with a Q factor of 6.4 at 5.9 GHz. The resistances of the bias resistors 527, 529 and 543 are 10 kΩ and the bias voltage Vb1 is 2.2 V. The bias voltage Vb3 is 3 V.

Particular advantages of this embodiment are:
use of a capacitor divider circuit avoids delay in the coupled signal so as to obtain maximum oscillator frequency and the capacitors perform a dual function as the gyrator capacitors. In addition the capacitors increase the efficiency of the VCO over that using a resistor attenuator;

the large signal swing output increases the carrier to noise ratio and so reduces the phase noise;

the inductors inductance and quality factor are chosen for ease of practical implementation at the oscillator frequency. Also since the function of the inductor is to partially cancel the gyrator capacitance, relatively large capacitors are used which swamp the non-linearities due to the transistor parasitic capacitance.

Due to the low impedance presented by the shunt capacitors Ca at the input of the amplifiers, and the relatively large input signal, the noise performance of the amplifiers is good.

II-3. Second Embodiment

Figure 14:
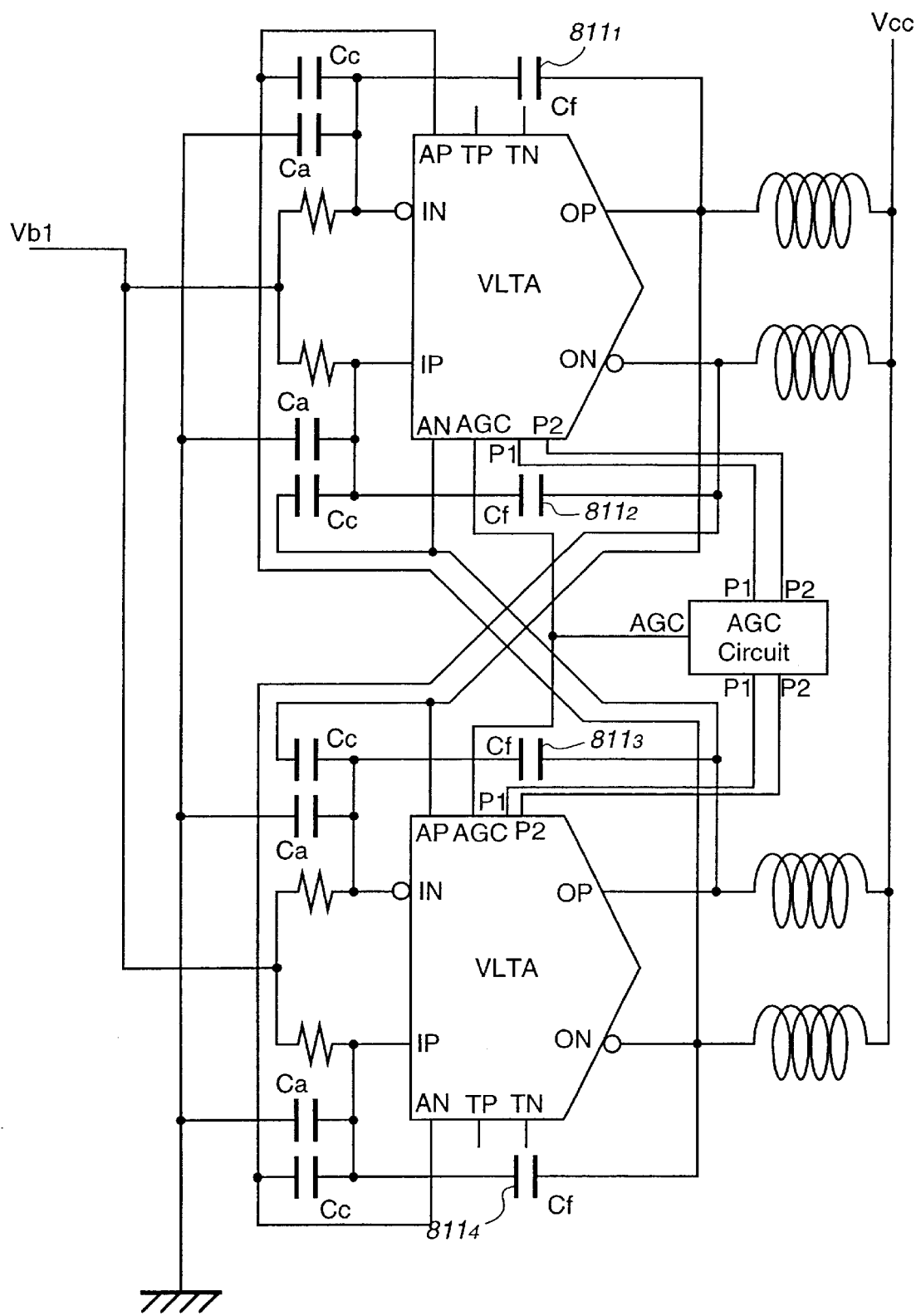
FIG. 14 is a schematic diagram of another embodiment of a gyrator according to the present invention.

FIG. 14 shows another embodiment including Miller feedback capacitors $811_1$, $811_2$, $811_3$ and $811_4$ which are connected between the respective non-inverting or inverting output and the inverting or noninverting input of the VLTAs. The capacitors $811_1$, $811_2$, $811_3$ and $811_4$ are employed to further linearize the gyrator.

II-4. Limitations of the First and Second Embodiment Gyrators

The first and second embodiment gyrators are disclosed in pending U.S. application Ser. No. 09/056,711 filed by the same inventor on Apr. 8, 1998. In the gyrator, the advantages of inductive loads for such gyrators are exploited. Specific improvements using inductive loads include, larger amplitude signals, extended high frequency performance, lower harmonic distortion with consequential improved phase noise and discrimination against power supply noise. It has been found however, that the improved gyrator has a practical limitation imposed by the response time of the automatic output level control. In the gyrator, the use of inductive loads required that the inductance should be large enough that the inductive admittance is less than the capacitive admittance of the gyrator nodal capacitors. If this condition is met, the inductive admittance will partially cancel the capacitive admittance. The overall nodal impedance is a reduced capacitive reactance and this reduced capacitive reactance permits the oscillator, for example, to oscillate at higher frequencies. The resultant oscillator frequency is higher than the resonant frequency of the parallel combination of the inductive load and the nodal capacitance. Such a gyrator, with inductive loads has the capability of oscillating at the gyrator resonant frequency, or alternatively, at the resonant frequency of the parallel combination of the inductive load and nodal capacitance. To be more precise, at the gyrator resonant frequency, the reduced nodal capacitance of one node appears as a parallel inductance to the reduced nodal capacitance of the other node and the quality factor of this resonant combination can be at least as high as 250. On the other hand, the quality factor of integrated inductors can be typically 3. Thus the quality factor of the gyrator resonant circuit is about two orders of magnitude greater than the quality factor of the resonant combination of inductive load and nodal capacitance. Under normal operation, the gyrator chooses to oscillate at the resonant frequency with the higher quality factor. However, under some circumstances, where the oscillation is allowed to increase beyond the normal linear range of the gyrator, increased harmonic distortion lowers the gyrator quality factor and spurious oscillations at the frequency of the resonant combination of inductive load and nodal capacitance can result. An example of such a possibility occurs when the gyrator is rapidly tuned from one frequency to another. Under these circumstances, large changes in the loop gain of the gyrator can occur, causing the amplitude to overshoot the linear region and allowing spurious oscillations to build up. To prevent this spurious operation in the first and second embodiment gyrators, it is necessary to limit the rapidity with which the gyrator is tuned. In practice, this imposes a limit on the bandwidth of the filter of a phase locked loop, or similar application of the gyrator.

III. Third Embodiment Gyrator

A third embodiment gyrator with inductive loads removes the limitations of the first and second embodiment gyrators.

Figure 15:
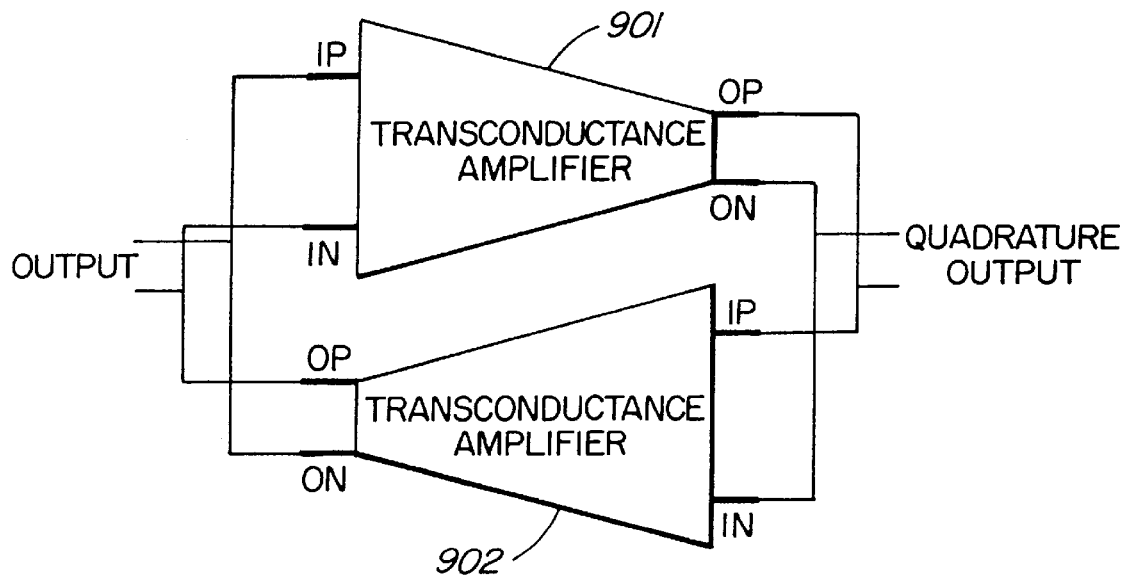
FIG. 15 is a schematic diagram of a gyrator according to another embodiment of the present invention.

Referring to FIG. 15 which shows a gyrator according to another embodiment of the present invention, the gyrator includes two transconductance amplifiers 901, 902, each having non-inverting and inverting inputs and outputs. The non-inverting and inverting output terminals OP and ON of the transconductance amplifier 901 are connected to the non-inverting and inverting input terminals IP and IN of the transconductance amplifier 902, respectively. The non-inverting and inverting output terminals OP and ON of the transconductance amplifier 902 are connected to the inverting and non-inverting input terminals IN and IP of the transconductance amplifier 901, respectively.

The possibility of separating the AGC circuit from the tuning control arises out of the properties of a translinear amplifier. The output stage of the gyrator variable linear transconductance amplifiers is a translinear amplifier. In the above mentioned gyrator, the transconductance is varied by variation of the tail current of the output differential pair. However, the tuning arrangement also employed two additional differential pairs whose inputs are connected in parallel with the output differential pair, and whose outputs are arranged as quadrature feedback signals to the alternate gyrator output. For tuning purposes the tail currents of the quadrature differential pairs is varied. Control of the transconductance also required that the tail currents of the quadrature differential pairs should be varied. The resultant tuning circuit of FIG. 11 requires both tuning control signals as well as AGC control.

Figure 16:
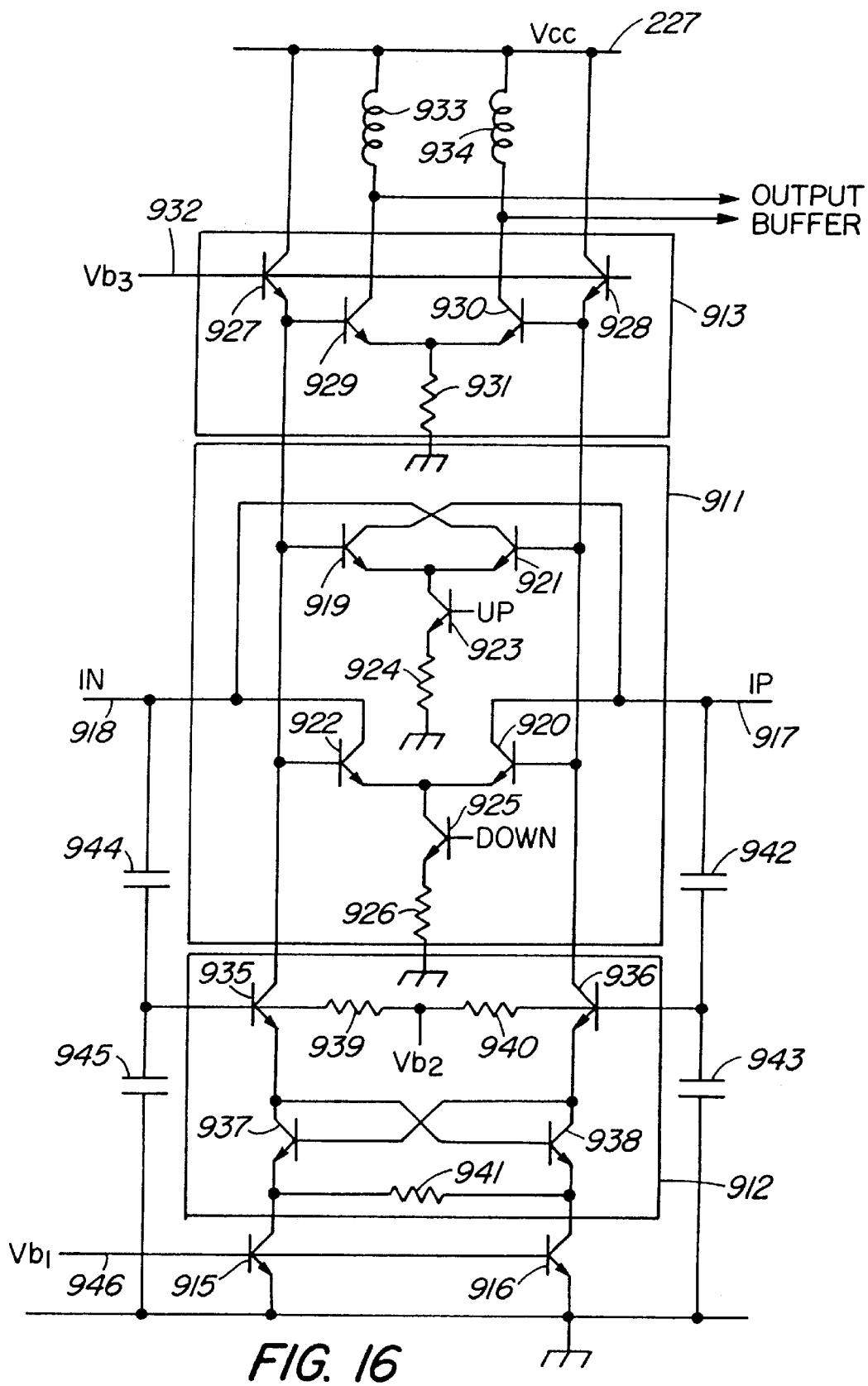
FIG. 16 is a schematic diagram of a transconductance amplifier used in the gyrator shown in FIG. 15.

Referring to FIG. 16 which shows the transconductance amplifier used in the gyrator, AGC control of the tail currents of the output differential pair and the tuning quadrature differential pairs is eliminated, so that the bias current of the output differential pair is fixed and the tuning control is much simpler.

Each of the transconductance amplifiers 901, 902 includes a tuning amplifier 911, a transadmittance amplifier 912 and a translinear amplifier 913 which are cascaded between a terminal 227 of supply voltage Vcc (e.g., +5 V) and the ground terminal via transistors 915, 916. The tuning amplifier 911 has non-inverting and inverting input terminals 917 and 918 which are connected to the collectors of transistors 919, 920 and 921, 922, respectively. The emitters of the transistors 919, 921 are connected to the collector of a transistor 923, the emitter of which is connected to the ground terminal via a resistor 924. The emitters of the transistors 920, 922 are connected to the emitter of a transistor 925, the emitter of which is connected to the ground terminal via a resistor 926. The bases of the transistors 919, 922 and 921, 920 are connected to the emitter of transistors 927 and 928, respectively, of the translinear amplifier 913. The emitters of the transistors 927, 928 are connected to the bases of transistors 929, 930, the emitters of which are connected to the ground terminal via a resistor 931. The bases of the transistors 927, 928 are connected to a bias input terminal 932 of bias voltage Vb3. The collectors of the transistors 927, 928 are connected to the Vcc voltage terminal. The collectors of the transistors 929, 930 are connected to the voltage terminal via inductors 933, 934, respectively. The collectors of the transistors 929 and 930 are noninverting and inverting output terminals OP and ON of the transconductance amplifiers 901 and 902 of FIG. 15. The bases of the transistors 922, 920 of the tuning amplifier 911 are connected to the collectors of transistors 935, 936 of the transadmittance amplifier 912, respectively. The emitters of the transistors 935, 936 are connected to the collectors of transistors 937, 938, the emitters of which are connected to the collectors of the transistors 915, 916, respectively. The bases of the transistors 937, 938 are connected to the collectors of the transistors 938, 937. The bases of the transistors 935, 936 are connected to each other via series-connected resistors 939, 940. The emitters of the transistors 937, 938 are connected to each other via a resistor 941. Series-connected capacitors 942, 943 are connected between the non-inverting input terminal 917 and the ground terminal. Series-connected capacitors 944, 945 are connected between the inverting input terminal 918 and the ground terminal. The joints of the capacitors 942, 943 and 944, 945 are connected to the bases of the transistors 936 and 935, respectively. The bases of the transistors 915, 916 are connected to a bias terminal 946 of bias voltage Vb1.

The current gain of the translinear amplifier 913 is equal to the ratio of the input and output bias currents. The gain of the translinear amplifier 913 is decreased by increasing the bias current of the input signal of the translinear amplifier 913.

The input stage of the gyrator variable transconductance amplifier is a linear transadmittance amplifier which employs positive feedback of transistors 937, 938 to compensate for the non-linearity of transistors 935, 936. The actual gain of this transadmittance amplifier is fixed by the value of resistor 914. Thus, the gain of the transadmittance amplifier is independent of the bias current supplied by transistors 915, 916. However increasing the bias current of the transadmittance amplifier 912 permits it to handle larger signals without over-loading the amplifier. It is desireable therefore, that as the oscillation signals build up in amplitude, that the bias current of the transadmittance amplifier 912 should be increased.

It will be observed that the same bias current output from the transadmittance amplifier 912 is the input bias current for the translinear amplifier 913. Automatic gain control requires that as the oscillation signals increase in amplitude, the input bias current of this translinear amplifier 913 be increased. The combined circuit of the transadmittance and translinear amplifiers 912 and 913 therefore exhibits the desirable property that the bias current of the transadmittance amplifier 912 can be increased both to accommodate increasing oscillation amplitudes and to limit these amplitudes by lowering the gain of the translinear amplifier 913. The operation of the gyrator transconductance amplifiers 901, 902 is thus optimized. Finally, since the bias current of the output differential pairs of the translinear amplifier 913 is now independent of the gain control function, it can be fixed and optimized for optimum performance of the output transistors. This latter property is desirable since by biasing the output differential pair close to the optimum for maximum gain-bandwidth product ($f_T$) the transistor size can be chosen for minimum parasitic capacitance resulting in either maximum linearity, or maximum oscillator frequency, or a combination of both.

Figure 17:
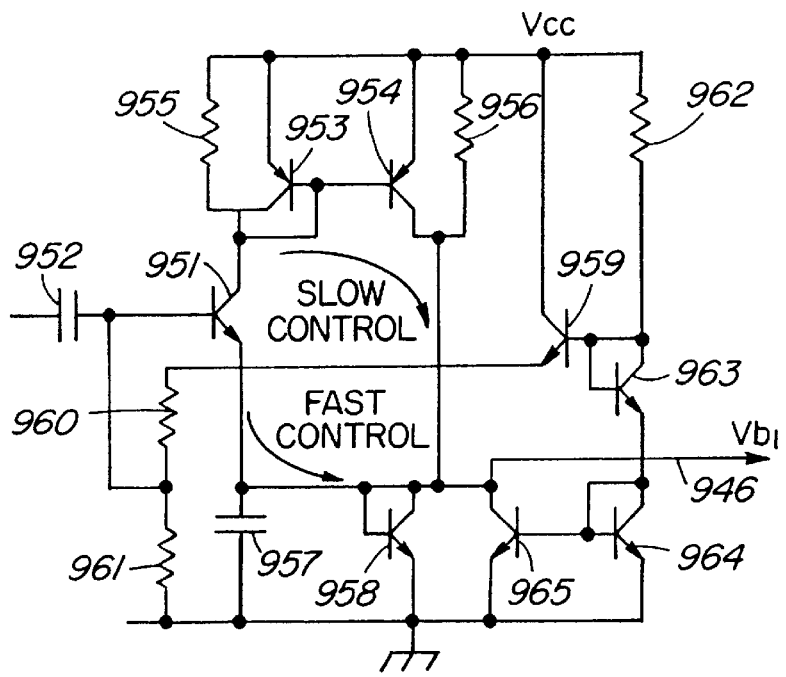
FIG. 17 is a schematic diagram of a peak detector used in the transconductance amplifier shown in FIG. 16.

FIG. 17 shows a peak detector. In FIG. 17, the base of a transistor 951 is connected to the oscillator buffered output terminal via a capacitor 952. The collector of the transistor 951 is connected to the collector of a diode-connected transistor 953, the base of which is connected to the base of a transistor 954. The emitters of the transistors 953, 954 are connected to the Vcc voltage terminal. Resistors 955, 956 are connected between the collector and emitter of the transistors 953, 954, respectively. The emitter of the transistor 951 is connected to the ground terminal via a capacitor 957 and a diode-connected transistor 958. The emitter of a transistor 959 is connected to the ground terminal via series-connected resistors 960, 961 for adjusting the threshold of peak detection. The joint of the resistors 960, 961 is connected to the base of the transistor 951. The collector of the transistor 959 is connected to the voltage terminal. A resistor 962 and two diode-connected transistors 963, 964 are connected in series between the voltage terminal and the ground terminal. The base of the transistor 959 is connected to the collector of the transistor 963. The base of the transistor 964 is connected to the base of a transistor 965, the emitter of which is connected to the ground terminal. The emitters of the transistor 951, and the collectors of the transistors 954, 958, 965 are connected to the bias terminal 946 of the bias voltage Vb1 of the transconductance amplifier shown in FIG. 16.

Figure 18:
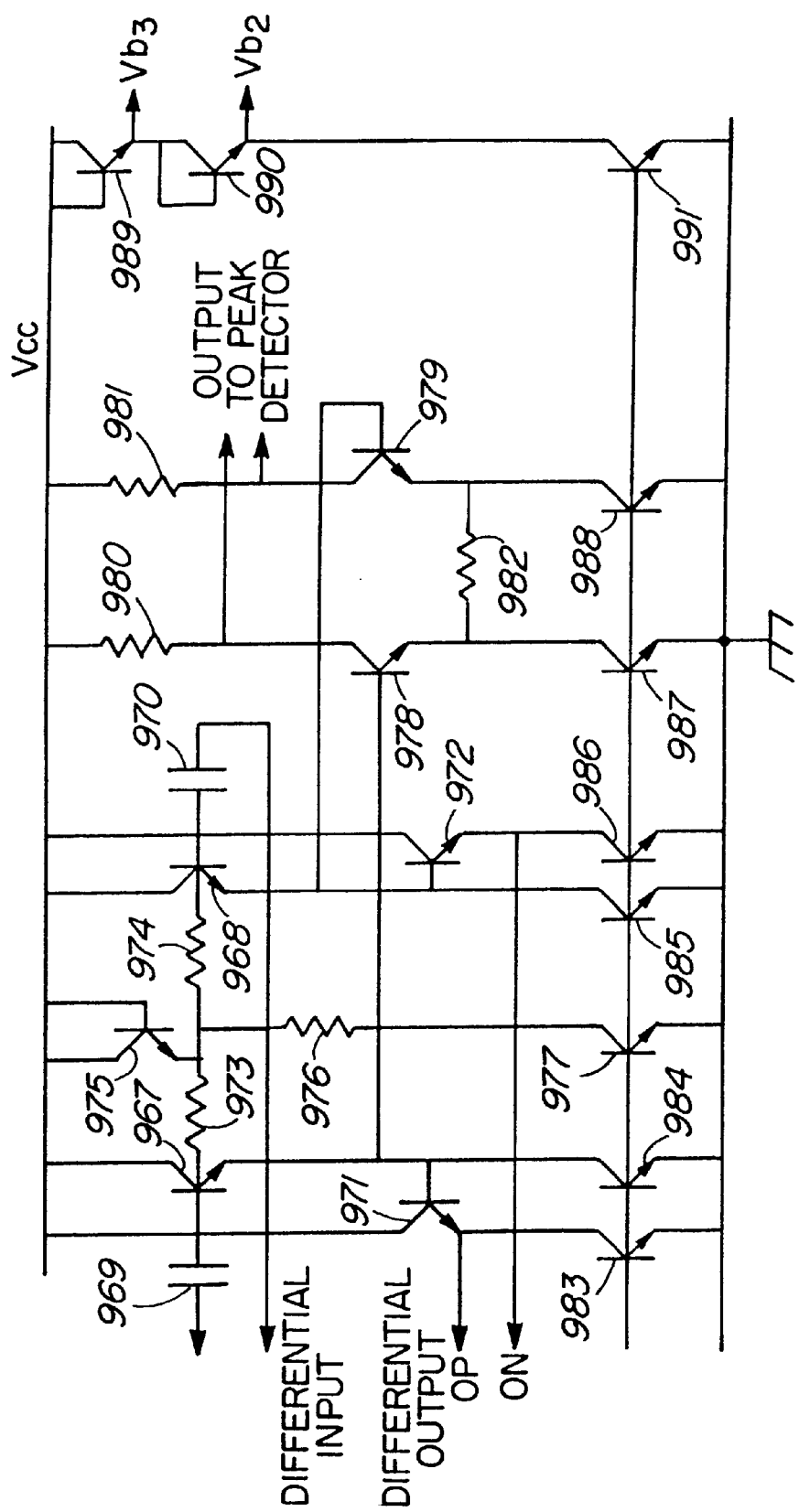
FIG. 18 is a schematic diagram of an output buffer and bias circuit used in the transconductance amplifier shown in FIG. 16.

FIG. 18 shows an output buffer and bias circuit used in the transconductance amplifier. In FIG. 18, the bases of emitter follower transistors 967, 968 are connected via capacitors 969, 970 to the collectors of the transistors 930, 929 of the transconductance amplifier of FIG. 16. The emitters of the transistors 967, 968 are connected to the bases of transistors 971, 972, the emitters of which are to be used as buffered outputs of the oscillator. The bases of the transistors 967, 968 are connected to each other via series-connected resistors 973, 974, the junction of which is connected to a terminal of dc supply voltage Vcc (e.g., +5 volts) via a diode-connected transistor 975 and to the ground terminal via a series-connected resistor 976 and diode-connected transistor 977. The emitters of the transistors 967, 968 are connected to the bases of transistors 978, 979, the collectors of which are connected to the Vcc terminal via resistors 980, 981. The emitter of the transistor 978 is connected to the emitter of the transistor 979 via a resistor 982. The collectors of the transistors 971, 967, 968 and 972 are connected to the Vcc terminal. The emitters of the transistors 971, 967, 968, 972, 978 and 979 are connected to the ground terminal via transistors 983, 984, 985, 986, 987 and 988, respectively. Two diode-connected transistors 989, 990 and a transistor 991 are connected in series between the Vcc terminal and the ground terminal. The bases of the transistors 983, 984, 977, 986, 987, 988 and 991 are connected to a bias voltage source, formed by transistors 975, 985 and resistor 976, to provide bias currents necessary to their connected transistors. The collector of the transistor 978 is connected to the capacitor 952 of the peak detector shown in FIG. 17. The emitter of the transistor 990 is connected to the junction of the resistors 939, 940 of the transconductance amplifier shown in FIG. 16 to supply the bias voltage Vb2, which is the voltage difference between the supply voltage Vcc and the collector-emitter voltages Vce of the two transistors 989 and 990. The emitter of the transistor 989 is connected to the terminal 932 of the transconductance amplifier shown in FIG. 16 to supply the bias voltage Vb3, which is the voltage difference between the supply voltage Vcc and the collector-emitter voltage Vce of the transistor 989.

The requirement for the peak detector is that it respond rapidly to changes in signal amplitude, increasing the bias current to the input of the translinear amplifier 913 as the signal level increases. This is accomplished by using emitter followers that become conducting once the signal level exceeds a given amplitude. In the peak detector circuit of FIG. 17, the transistor 951 represents one such emitter follower. The capacitor 952, the transistor 951 and the resistors 960, 961 are multiplicated four times to service the four outputs of the oscillator. The emitter current of the transistor 951 is passed directly to the bias circuit of the transadmittance amplifiers 912 and so controls the gain of the translinear amplifiers 913. The response time of the peak detector is very fast due to the short response time of the emitter followers. The attack and decay times of the peak detector circuit for a 2.5 GHz oscillator are typically of the order of 1 nanosecond or less. As a result the gyrator transconductance amplifiers 901, 902 always operate in the linear region and so prevent operation at spurious frequencies. Changes in the emitter current of the emitter followers as they follow the peaks of the oscillation are reflected in changes in the base emitter voltage of these transistors. As a result, the ability of the peak detector to control the oscillation peaks is subject to some variance. For example, over the tuning range of the oscillator the bias current may vary by a factor of 3, causing a variation in the emitter follower base emitter voltage. In order to enable tighter control of the oscillator signal, the collector current of the emitter follower transistor 951 can be used in conjunction with a high gain PNP mirror formed of the transistors 953, 954 to add a second, slower, high gain bias control. As a result, the peak detector contains two control loops, the first a fast acting loop for oscillator stability control and the second a slower control loop for fine adjustment of the oscillator output level. In accordance with an object of this invention, the resulting fast acting automatic level control permits the oscillator to be tuned over its entire range in less than 10 ns, without any instability or spurious oscillations.

An added feature of the peak detector circuit of FIG. 17 is the additional transistor 965, the function of which is to remove power supply dependency from the oscillator. If the resistors 956 and 962 have the same resistance and the transistors 963, 964, 965 and 958 all have the same size, the current $I_{958}$ through the diode connected transistor 958 will be given by:

$$I_{958} = V_{be}/R_{962}$$

Where Vbe is a voltage between the base-emitter of the transistors 963, 964, 965 and 958 and $R_{962}$ is a resistance of the resistor 962. Thus, the current $I_{958}$ is independent of the supply voltage Vcc. Clearly the sizes of the resistor 962 admittance and the transistors 963 and 964 can be reduced proportionately without impairing the ability to resist bias variations due to the power supply.

Simulated performance of the gyrator shows that the frequency changes 1% for a 0.5 volt variation of the supply voltage.

Specific improvements include:

(i) simplification of the AGC circuit and the tuning control by separation of these two functions;

(ii) reduction of the tuning circuit of FIG. 11 from a total of 17 transistors to 6;

(iii) reduction of the time constant of the AGC circuit by more than an order of magnitude; and (iv) reduction of the influence of the power supply voltage on the AGC and bias circuit of the oscillator.

Although particular embodiments of the present invention have been described in detail, it should be appreciated that numerous variations, modifications, and adaptations may be made without departing from the scope of the present invention as defined in the claims. For example, the channel types of the FETs and the types of the bipolar transistors may inverse.

What is claimed is:

1. A gyrator forming a resonant circuit comprising:

a loop having ports 1 and 2, each port having two terminals, the loop comprising loop-connected first and second amplifiers, the gain of the loop being more than unity;

capacitive means for coupling the terminals of the respective ports, thereby causing effective nodal capacitance in each port and effective nodal inductance in the other port, the capacitance and inductance determining the resonant frequency of the gyrator; and inductive means for coupling the terminals of the respective ports, thereby the effective nodal capacitance in the respective port being varied, the first and second amplifiers of the loop comprising first and second differential amplifiers, respectively, each differential amplifier having inverting and non-inverting inputs and outputs, the loop comprising amplifier coupling means for coupling the inverting and non-inverting outputs of the first differential amplifier to the non-inverting and inverting inputs of the second differential amplifier, respectively, and for coupling the inverting and non-inverting outputs of the second differential amplifier to the inverting and non-inverting inputs of the first differential amplifier, respectively, the gain of the loop comprising the first and second differential amplifiers being greater than unity, each of the first and second differential amplifiers having a generally 90 degree phase shift between its input and output at the resonant frequency, each of the first and second differential amplifiers comprising a variable transconductance amplifier comprising tuning means and transconductance amplifying means, the transconductance amplifying means comprising first and second transistors for amplifying differential output from the differential amplifier, the tuning means tuning with differential voltage between the collectors of the first and second transistors.

2. The gyrator of claim 1, wherein the variable transconductance amplifier further comprises loads, the amplifiers being operative in the linear region thereof.

3. The gyrator of claim 2, wherein the loads comprise a resistive element.

4. The gyrator of claim 2, wherein the loads comprise a low quality factor inductive element.

5. The gyrator of claim 1, wherein the variable transconductance amplifier further comprises automatic gain control means which is electrically separated from the tuning means.

6. The gyrator of claim 5, wherein the tuning means is functionally dependent upon the automatic gain control means.

7. The gyrator of claim 6, wherein the automatic gain control means comprises a fast acting control loop to ensure oscillation stability under rapid tuning variations.

8. The gyrator of claim 7, further comprising a second slower control loop for precision vernier adjustment of an output signal level.

9. The gyrator of claim 8, wherein the fast acting control loop is augmented with the second slower control loop.

10. The gyrator of claim 9, wherein an oscillation frequency responds to the variation of the transconductance of the transconductance amplifying means.

11. The gyrator of claim 9, wherein the oscillation frequency responds to a variable amplifier built in delay and a precisely controlled output signal level.

* * * * *